United States Patent
Ho et al.

(10) Patent No.: US 11,430,693 B1
(45) Date of Patent: Aug. 30, 2022

(54) METHOD FOR MICROSTRUCTURE MODIFICATION OF CONDUCTING LINES

(71) Applicant: YUAN ZE UNIVERSITY, Taoyuan (TW)

(72) Inventors: Cheng En Ho, Taoyuan (TW); Cheng Yu Lee, Taoyuan (TW); Ping Chou Lin, Taoyuan (TW); Chih Pin Pan, Taoyuan (TW); Chih Hao Chang, Taoyuan (TW)

(73) Assignee: YUAN ZE UNIVERSITY, Taoyuan (TW)

( * ) Notice: Subject to any disclaimer, the term of this patent is extended or adjusted under 35 U.S.C. 154(b) by 0 days.

(21) Appl. No.: 17/197,965

(22) Filed: Mar. 10, 2021

(51) Int. Cl.
H01L 21/768 (2006.01)
C25D 3/56 (2006.01)
H01L 23/00 (2006.01)
H01L 23/532 (2006.01)

(52) U.S. Cl.
CPC ........ *H01L 21/76864* (2013.01); *C25D 3/562* (2013.01); *H01L 23/53204* (2013.01); *H01L 24/05* (2013.01); *H01L 2924/01026* (2013.01); *H01L 2924/01027* (2013.01); *H01L 2924/01028* (2013.01); *H01L 2924/01029* (2013.01); *H01L 2924/01047* (2013.01); *H01L 2924/01078* (2013.01); *H01L 2924/01079* (2013.01); *H01L 2924/01082* (2013.01); *H01L 2924/01084* (2013.01)

(58) Field of Classification Search
CPC ......... H01L 21/76864; H01L 23/53204; H01L 24/05; H01L 2924/01026; H01L 2924/01027; H01L 2924/01028; H01L 2924/01029; H01L 2924/01047; H01L 2924/01078; H01L 2924/01079; H01L 2924/01082; H01L 2924/01084; C25D 3/562

See application file for complete search history.

(56) References Cited

U.S. PATENT DOCUMENTS

| | | | |
|---|---|---|---|
| 9,449,874 B1* | 9/2016 | Standaert | H01L 21/76846 |
| 2004/0004289 A1* | 1/2004 | Ueno | H01L 21/2885 |
| | | | 257/E21.174 |
| 2004/0014312 A1* | 1/2004 | Kunishima | H01L 21/76883 |
| | | | 257/E21.585 |
| 2004/0219779 A1* | 11/2004 | Basol | H01L 21/2885 |
| | | | 257/E21.585 |
| 2007/0238294 A1* | 10/2007 | Beyer | H01L 21/2855 |
| | | | 438/687 |
| 2009/0297759 A1* | 12/2009 | Chanda | H01L 21/76877 |
| | | | 428/83 |

(Continued)

*Primary Examiner* — Douglas W Owens
(74) *Attorney, Agent, or Firm* — Chih Feng Yeh; Huntington IP Consulting Co., Ltd.

(57) ABSTRACT

A method for microstructure modification of conducting lines is provided. An electroplating process is performed to deposit the metal thin film/conducting line(s) with a face-centered cubic (FCC) structure and a preferred crystallographic orientation over a surface of a substrate. The metal thin film/conducting line(s) is subsequently subjected to a thermal annealing process to modify its microstructure with the grain sizes in a range of 5 μm to 100 μm. The thermal annealing process is conducted at the temperature of above 25 degrees Celsius and below 240 degrees Celsius.

8 Claims, 6 Drawing Sheets

(56) References Cited

U.S. PATENT DOCUMENTS

2013/0147047 A1* 6/2013 Detzel ............... H01L 23/53238
257/762
2017/0170063 A1* 6/2017 Edelstein .......... H01L 21/76843

* cited by examiner

METHOD FOR MICROSTRUCTURE MODIFICATION OF CONDUCTING LINES

BACKGROUND

1. Technical Field

The present invention relates to a method for microstructure modification of metal thin film/conducting line(s), and more particularly to a method for microstructure modification of conducting line(s) to larger grain sizes.

2. Description of Related Arts

The electronic components in the manufacture process or normal-life use may be repeatedly operated in low-/high-temperature environments. Therefore, the electronic components must be designed to withstand severe thermal cycling test (TCT) conditions. During the thermal cycling test, the difference between coefficients of thermal expansion (CTE) of the substrate materials and interconnects may cause significant thermal stress, leading to the substrate warpage as well as the interconnect (conducting line) fracture. Specifically, the conducting lines or redistribution layer (RDL) utilized in high-end printed circuit boards (PCBs) and integrated fan-out (InFO) wafer-level packages are extremely fine, so that the mechanical properties (e.g., ductility/elongation) the conducting lines or RDL become the key factors of the mechanical/thermal reliability of PCBs and InFO wafer-level packages.

The Cu interconnects/conducting lines and redistribution layer used in PCBs and InFO wafer-level packages are usually fabricated via an electroplating process. The grain size of the electroplated Cu after self-annealing/low-temperature annealing is generally in a range of approximately 1 micrometer (μm) to 4 μm. In order to enlarge the Cu grain size to an even large size, a thermal annealing treatment must be subsequently conducted at a high-temperature environment (such as 250 degree Celsius or above) for a few hours. However, the thermal annealing treatment at high temperatures is not economic efficiency, and it also easily causes the thermal damage in other component materials. Therefore, to develop a method capable of effectively enlarging the grain sizes of conducting lines at low temperatures, to improve the ductility/elongation of interconnects/conducting lines becomes an important issue for the PCB and semiconductor industries.

SUMMARY

The objective of the present invention is to provide a method for microstructure modification of conducting lines, to solve the conventional problem.

In order to achieve the objective, the present invention discloses a method for microstructure modification of conducting lines, and the method includes: to perform an electroplating process to deposit conducting lines with a preferred crystallographic orientation over a substrate; to perform a low-temperature heat (thermal annealing) treatment on the conducting lines, and to make the conducting lines with crystal grain sizes in a range of 5 μm to 100 μm, wherein the low-temperature heat treatment is conducted at a temperature of above 25 degree Celsius (° C.) and below 240 degree Celsius.

According to an embodiment of the present invention, the substrate includes a conducting substrate, an insulating substrate or a combination thereof.

According to an embodiment of the present invention, the electroplating process is performed with a plating current density in a range of 0.1 amp/dm$^2$ (ASD) to 10.0 ASD.

According to an embodiment of the present invention, the metal thin film has a thickness in a range of 0.1 μm to 500 μm.

According to an embodiment of the present invention, the metal thin film has the preferred crystallographic orientation, where less than 50% of the surface of the metal thin film can have the (111) crystal plane preferred orientation with a nanotwinned structure, and the thermal annealing treatment is conducted at a temperature in a range of 25 degree Celsius to 240 degree Celsius.

According to an embodiment of the present invention, a plating solution used in the electroplating process comprises organic acid, inorganic acid or a combination thereof.

According to an embodiment of the present invention, the plating solution includes organic additives.

According to an embodiment of the present invention, the thermal annealing treatment is conducted for more than one minute and less than 50 hours.

According to an embodiment of the present invention, the metal thin film has a plurality of crystal grains with the preferred crystallographic orientation before the thermal annealing treatment is applied to the metal thin film.

According to an embodiment of the present invention, material of the metal thin film comprises gold (Au), silver (Ag), copper (Cu), cobalt (Co), iron (Fe), nickel (Ni), lead (Pb), palladium (Pd), platinum (Pt) or a combination thereof.

According to above contents, the difference between the present invention and the conventional technology is that in the present invention the electroplating process is performed to deposit the metal thin film with a preferred crystallographic orientation over the substrate, and the thermal annealing treatment is performed on the metal thin film to enlarge the grain size of the metal thin film to be greater than 5 μm and less than 100 μm, and the thermal annealing treatment is conducted at the temperature in a range of 25 degree Celsius to 240 degree Celsius for more than one minute and less than 50 hours.

By the aforementioned technical solution, the present invention is able to prepare the metal thin film with larger grain sizes, so as to achieve the technical effect of improving elongation/ductility of the conducting line(s).

BRIEF DESCRIPTION OF THE DRAWINGS

The structure, operating principle and effects of the present invention will be described in detail by way of various embodiments, which are illustrated in the accompanying drawings.

DETAILED DESCRIPTION

Figure 1:
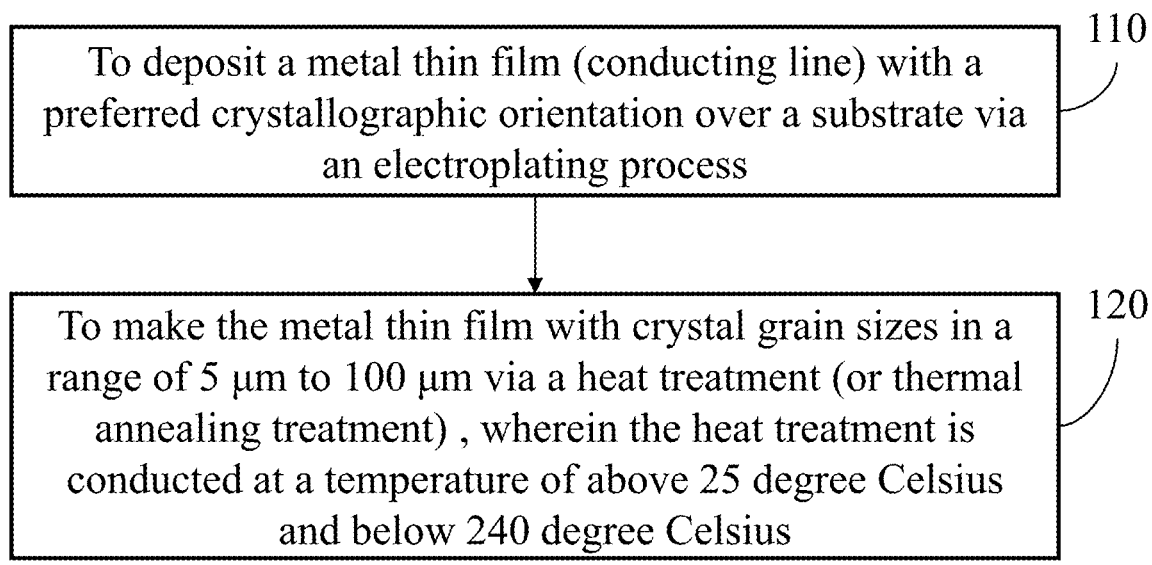
FIG. 1 is a flowchart of an embodiment of a method for microstructure modification of the metal thin film (conducting line), according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Before description of the method for microstructure modification of conducting lines, the terms defined in the present invention are explained in following paragraph first. The coordinates of crystallographic directions and crystallographic planes are generally described by the Miller indices, where (hkl) and [hkl] represent the specific crystallographic plane and crystallographic direction in the crystal lattice, respectively. All permutations of (hkl) and [hkl] with their negatives constitute {hkl} and $\langle hkl \rangle$, respectively, for the cubic crystal system.

Please refer to FIG. 1, which is a flowchart of an embodiment of a method for microstructure modification of the metal thin film (conducting line), according to the present invention. In this embodiment, the method is used to prepare a metal thin film or conducting line(s) with larger grain sizes. As shown in FIG. 1, the method includes the following steps. In the step 110, an electroplating process is performed to deposit the metal thin film with a face-centered cubic (FCC) structure with a preferred crystallographic orientation over a surface of the substrate. In the step 120, a heat treatment, which is also called thermal annealing treatment herein, is performed on the metal thin film, to make the metal thin film have the grain size in a range of 5 μm to 100 μm, and the heat treatment is conducted at a temperature in a range of 25 degree Celsius to 240 degree Celsius.

In the step 110, the substrate to be electroplated can be prepared in advance. For example, the substrate can include a conducting substrate an insulating substrate or a combination thereof. The conducting substrate can include a metal substrate, a graphite substrate or a combination thereof. The insulating substrate can include a printed circuit board, a silicon substrate, a compound semiconductor substrate, a glass substrate, a quartz substrate, a plastic substrate, a ceramic substrate or a combination of thereof. It should be noted that the insulating substrate is a non-conductor, so that another conducting layer must be pre-plated on the surface of the insulating substrate through plating process, such as electroless plating process, physical vapor deposition (PVD) process, or chemical vapor deposition (CVD) process, so as to make the surface of the insulating substrate conductive, thereby facilitating the electrodeposition of the conducting layer. For example, the material of the conducting layer can be selected from the group consisting of gold, silver, copper, cobalt, iron, nickel, lead, palladium, platinum or a combination of the aforementioned elements. The conducting layer can be disposed either on the surface of substrate or in the interior of substrate thereof, and the thickness of the substrate can be, for example but not limited to, in a range of 0.1 μm to 100 millimeter. It should be noted that implementation of the present invention is not limited to the above-mentioned embodiment and can be adjusted according to practical demand.

Next, a patterned photoresist can be formed on the surface of the substrate to be plated according to user's requirement, (that is, the existing photoresist coating manner, photolithography manner, etching manner and other manner are used to perform the photoresist exposure and development process), so that the metal thin film formed by the subsequent electroplating process can have a predetermined pattern. However, the present invention is not limited to above-mentioned embodiment, for example, in a condition that the user does not need the patterned metal thin film, the photoresist exposure and development process is no longer required, and the subsequent photoresist removal step can be omitted.

Next, a pretreatment process can be performed on the substrate to be plated, so as to remove stains and oxides existing on the substrate surface. In an embodiment, the pretreatment process can include using, in sequential order, water, cleaning/etching agent and so on to clean the substrate surface. It should be noted that the electroplating process will be performed later, so the substrate can be cleaned with water again before the subsequent electroplating process to prevent from impurities affecting the quality of the electroplated metal.

Next, after the pretreatment process, the substrate is placed in the plating solution with metal ions, and the electroplating process is performed with electric current, provided by a power supply device, of which the plating current density is in a range of 0.1 ASD to 10.0 ASD, so as to deposit the metal thin film with the preferred orientation structure on the surface of the substrate. In practice, less than 50% of the surface of the metal thin film can have the (111) crystal plane preferred orientation with a nanotwinned structure. The plating current density used in the electroplating process can be adjusted according to different substrate materials. In this case, the substrate to be electroplated is placed at the position of the cathode, and a soluble anode or an insoluble anode is disposed on the position of the anode. The soluble anode can supplement the metal ions consumed in the plating solution upon electroplating, and the insoluble anode can be, for example, titanium mesh, iridium/tantalum oxide composite anode. In this embodiment, the material of the anode can be, for example but not limited to, iridium/tantalum oxide composite insoluble anode. Furthermore, the plating solution can contain one of organic acid, inorganic acid, and a combination thereof, such as sulfuric acid ($H_2SO_4$), methanesulfonic acid or other mixtures. According to practical demand, the plating solution can be added with additive(s), such as gelatin, surfactant or crystal plane modifier. The metal ions of the plating solution can be selected from the group consisting of gold ions, silver ions, copper ions, cobalt ions, iron ions, nickel ions, lead ions, palladium ions, platinum ions. The material of the metal thin film can include gold, silver, copper, cobalt, iron, nickel, lead, palladium, platinum or a combination of the aforementioned elements. The metal ions of the plating solution can be adjusted according to the material of the expected metal thin film. The material of the metal thin film can have a face-centered cubic (FCC) crystal structure.

In this embodiment, the thickness of the metal thin film deposited in the electroplating process can be in a range of 0.1 μm to 500 μm; however, the present invention is not limited to above-mentioned embodiment, and the thickness can be adjusted according to actual needs. In an embodiment, the thickness of the metal thin film deposited in the electroplating process can be controlled by the plating current density and the corresponding plating time. Furthermore, the metal thin film has the preferred crystallographic orientation, where less than 50% of the surface of the metal thin film can have the (111) crystal plane preferred orientation with a nanotwinned structure.

In this embodiment, after the electroplating process is completed, that is, the deposited metal thin film has reached the expected thickness, tetrahydrofuran (THF) or sodium hydroxide (NaOH) can be used to remove the patterned photoresist covering the substrate, so as to reveal the metal thin film with the predetermined pattern.

Furthermore, when the temperature of the plating solution is lower than 25° C., the deposition rate of the metal thin film in electroplating process becomes too slow, and when the temperature of the plating solution is higher than 30° C., the additive(s) in the plating solution becomes unstable. Therefore, in this embodiment, during the electroplating process, the temperature of the plating solution should be controlled in a range of 25° C. to 30° C. by the temperature control device.

In the step 120, the heat treatment, which is also called a thermal annealing treatment, is performed on the substrate on which the metal thin film is disposed, and the heat treatment can be performed by isothermally heating the substrate in a thermal annealing furnace. The thermal annealing furnace can generate heat (or hot air) through electric heating, the user can adjust the temperature of the thermal annealing furnace to the temperature at which it is expected to heat the substrate, and to put the substrate with the metal thin film into the thermal annealing furnace for heating. For example, the expected temperature can be in a range of 25° C. to 240° C. In an embodiment, the thermal annealing treatment can be conducted for the time period in a range of one minute to 50 hours. Furthermore, in order to avoid the thermal oxidation of the metal thin film, noble gas such as nitrogen/argon can be supplied into the thermal annealing furnace, and the gas in the thermal annealing furnace can be exhausted from pipe. In this embodiment, the grain growth rate of the metal thin film is positively related to the annealing temperature and annealing time. Therefore, as the annealing temperature/time increases, the grain growth rate of the metal thin film increases accordingly.

The thermal annealing treatment is to provide the driving force (that is, energy) required for grain growth (that is, enlargement of grain size), so the method of the thermal annealing treatment is not limited to the isothermal heating process; instead, the method of the thermal annealing treatment can be changed according to practice needs, for example, the method of the isothermal thermal annealing treatment can also be performed by the isothermal/variable-thermal heating processes in different hot water baths, that is, by a combination of different thermal annealing treatments, and the substrate with the metal thin film can be placed in the different hot water baths to perform the thermal annealing treatments, and the water temperatures are different and can be adjusted in a range of 25° C. to 240° C.

By performing the step 120, the metal thin film can be formed with the grain size of greater than 5 μm and less than 100 μm. Generally, the grains of the metal thin film have a very important influence on the mechanical/electrical performances of the metal thin film, and when the grain size is larger, the grain boundaries are less, and it can greatly reduce the cracks produced by the grain boundaries when the metal thin film is bent, and also can increase the mechanical ductility and electrical conductivity of the metal thin film, so the metal thin film with larger grain size has the advantages of better flexibility and elongation and lower resistivity.

The present invention will be described in further detail with reference to the following preferred embodiments and the corresponding drawings. It should be noted that the experimental data disclosed in the following embodiments are examples for the convenience of explaining the technical features of the present invention, and the implementation of the present invention is not limited to these embodiments.

First embodiment

Figure 2A:
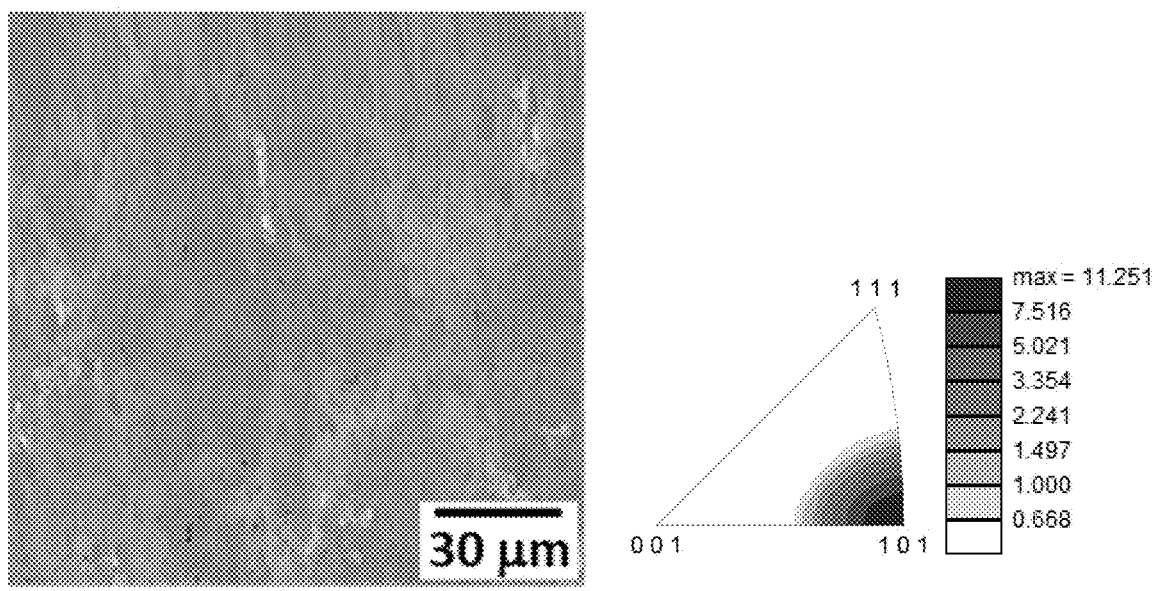
FIG. 2A shows a crystallographic orientation and an inverse pole figure (IPF), obtained by electron backscatter diffraction (EBSD), of the as-electroplated copper over a substrate before a heat treatment, according to the first embodiment of the present invention.
Figure 2B:
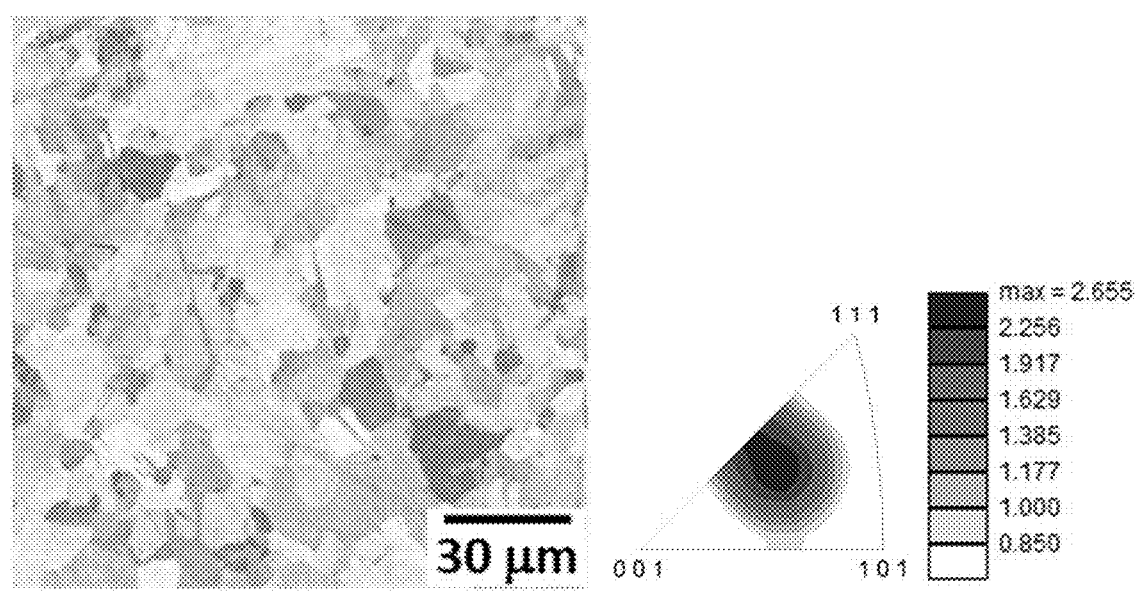
FIG. 2B shows a crystallographic orientation and an inverse pole figure, obtained by EBSD, of the as-electroplated copper of FIG. 2A after a heat treatment, according to the first embodiment of the present invention.

In the first embodiment, the copper substrate is selected as the substrate to be electroplated, and the electroplating process is performed after the pre-treatment process, and the photoresist exposure and development process is not performed in the first embodiment. The electroplating process is performed to deposit the electroplated copper with a thickness of approximately 20 μm on the pure copper substrate, and the electroplated copper has a (101) preferred orientation, as shown in FIG. 2A, where the crystallographic orientation and inverse pole figure (IPF) were obtained according to the EBSD characterization. For example, the electroplating process can be conducted with the plating current density in a range of 0.1 ASD to 10.0 ASD, and the plating solution can contain copper sulfate. Next, the thermal annealing treatment is performed on the pure copper substrate with the electroplated copper at 180° C. for 2 hours, and as a result, the grain size of the prepared electroplated copper is 10.78 μm, and the preferred orientation of the crystal planes is mainly (113) or (112), as shown in FIG. 2B, where the crystallographic orientation and the inverse pole figure were obtained according to the EBSD characterization.

Second embodiment

Figure 3A:
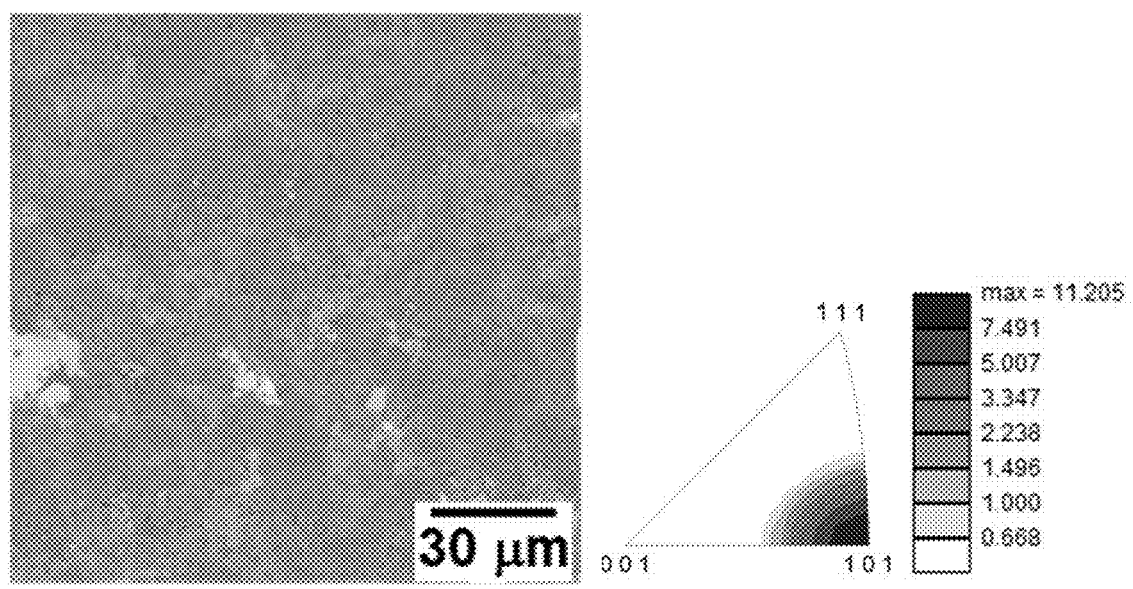
FIG. 3A shows a crystallographic orientation and an inverse pole figure, obtained by EBSD, of the as-electroplated copper over a substrate before a heat treatment, according to the second embodiment of the present invention.
Figure 3B:
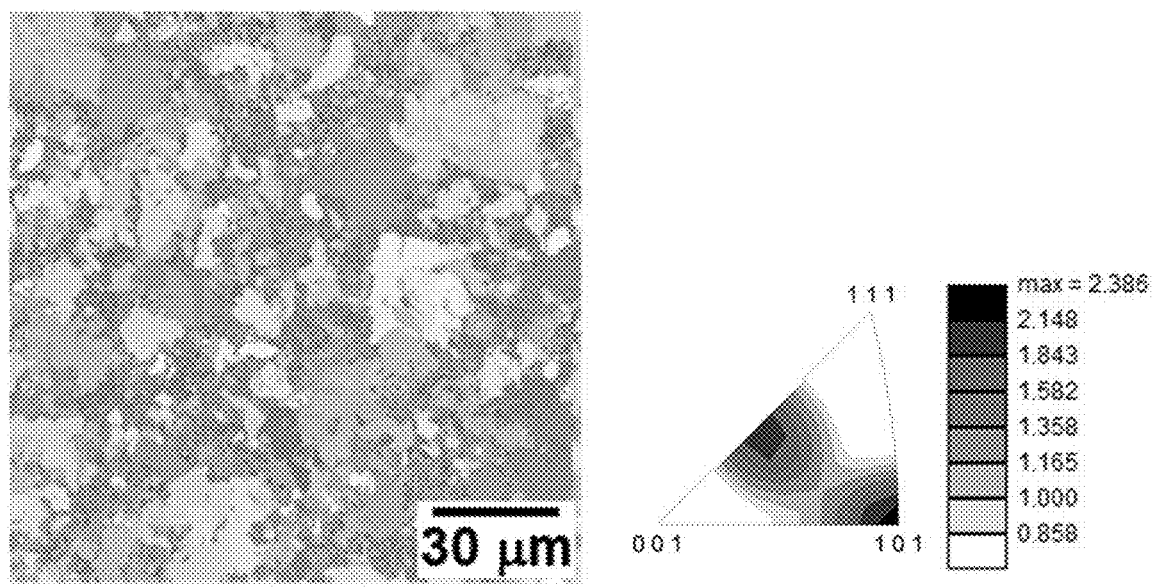
FIG. 3B shows a crystallographic orientation and an inverse pole figure, obtained by EBSD, of the as-electroplated copper of FIG. 3A after self-annealing (i.e., room-temperature annealing).

In this embodiment, the pure copper substrate is selected as the substrate to be electroplated, and the electroplating process is performed on the substrate after the pre-treatment process. The photoresist exposure and development process is not performed in the second embodiment. The electroplating process is performed to deposit the electroplated copper with a thickness of approximately 20 μm on the pure copper substrate, and the electroplated copper has a (101) preferential orientation, as shown in FIG. 3A, where the crystallographic orientation and inverse pole figure (IPF) were obtained according to the EBSD characterization. For example, the electroplating process can be conducted with the plating current density in a range of 0.1 ASD to 10.0 ASD, and the plating solution can contain copper sulfate. The pure copper substrate with the electroplated copper is annealed at 25° C. for 24 hours, that is, the self-annealing treatment is performed on the substrate, and as a result, the grain size of the prepared electroplated copper is 6.56 μm, and the preferred orientations of crystal plane is mainly (113) or (112), as shown in FIG. 3B, where the crystallographic orientation and inverse pole figure (IPF) were obtained according to the EBSD characterization.

Third embodiment

Figure 4A:
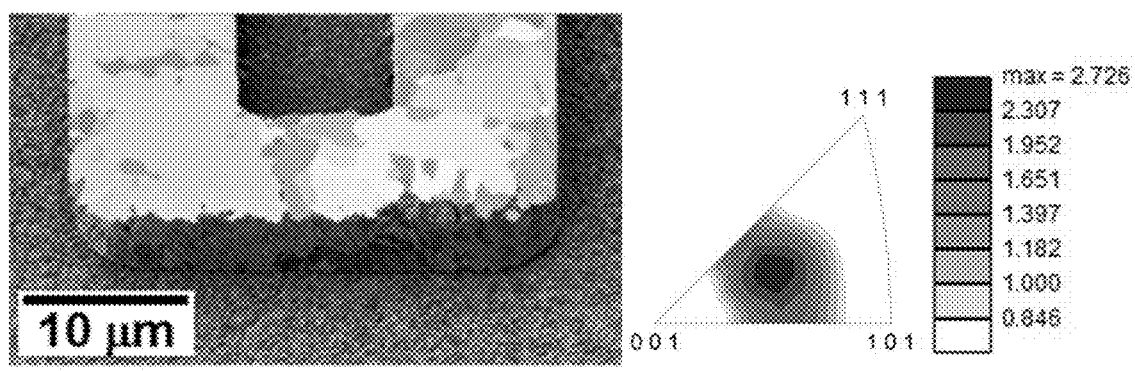
FIG. 4A shows a focused ion beam (FIB) microscopy image overlapped with the EBSD copper grain orientation map and inverse pole figure of electroplated copper conducting lines deposited on a glass substrate after the heat treatment, according to the third embodiment of the present invention.

In the third embodiment, the glass substrate is selected as the substrate to be electroplated, the substrate to be electroplated is disposed with the conducting layer on the surface thereof, and the electroplating process is performed on the substrate after the substrate is cleaned through the pretreatment process. The photoresist exposure and development process is performed in the third embodiment. The electroplating process is performed to deposit the electroplated copper with the thickness of approximately 5 μm on the glass substrate, similar with that performed in the first and second embodiments. The electroplating process can be conducted with the plating current density, for example, 1 ASD, and the plating solution can contain copper sulfate. Next, the glass substrate with the electroplated copper is annealed at 180° C. for 2 hours, and as a result, the grain size of the prepared electroplated copper is approximately 7μm with a crystallographic orientation of (113) or (112), as presented in the focused ion beam (FIB) microscopy image overlapped with EBSD orientation map and inverse pole figure (IPF) (FIG. 4A).

Figure 4B:
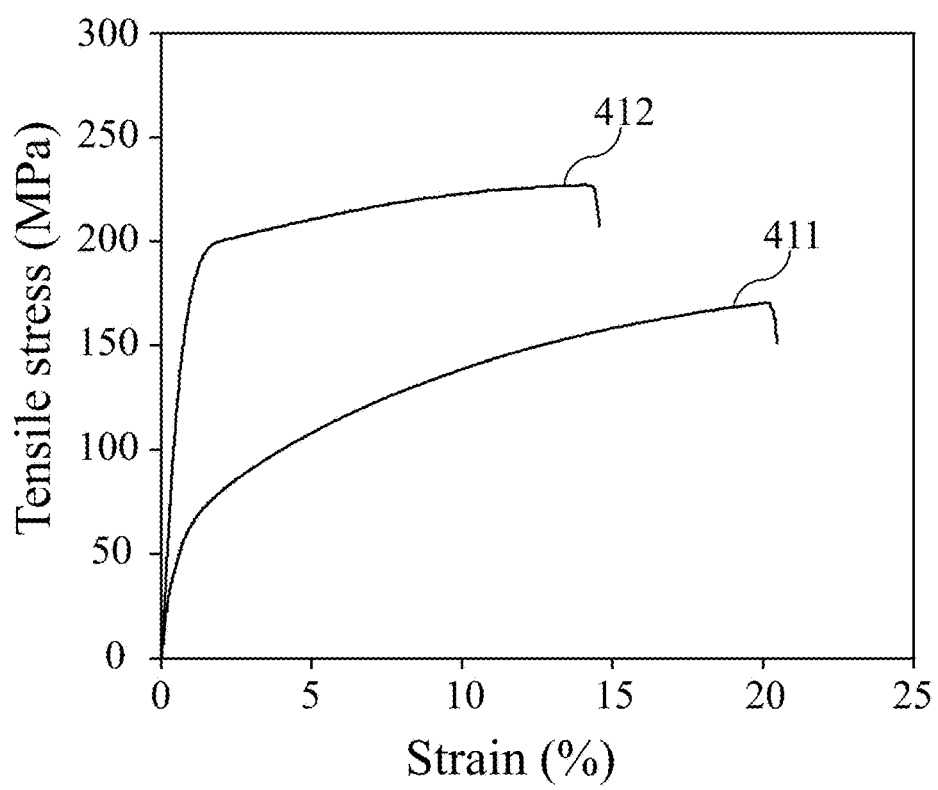
FIG. 4B shows tensile stress-strain curve of the modified electroplated copper of FIG. 4A corresponding to the electroplated Cu of the third embodiment of the present invention and unmodified commercial electroplated copper.

Furthermore, a tensile test is performed on the electroplated copper prepared in this embodiment at a constant strain rate of 0.05 mm/min per minute, according to the IPC-TM-650 standard. FIG. 4B presents the comparison between the tensile stress-strain curves of the modified electroplated copper 411 of FIG. 4A and the unmodified commercial electroplated copper 412. The horizontal axis of FIG. 4B is the strain percentage with a unit of %, and the vertical axis of FIG. 4B is the tensile stress with a unit of megapascal (MPa). The tensile test results show that the elongation of the electroplated copper prepared in this embodiment can reach as high as approximately 20.2% for a 20 μm-thick Cu film, which is much higher than the elongation of the unmodified commercial electroplated copper (approximately 15%) with the same thickness.

According to the above-mentioned content, it can be proved that the metal thin film prepared according to the method of the present invention can have much larger crystalline grains and high ductility, and these advantages are very helpful for preparation of conducting lines on printed circuit boards and integrated fan-out wafer-level packages.

Fourth embodiment

Figure 5:
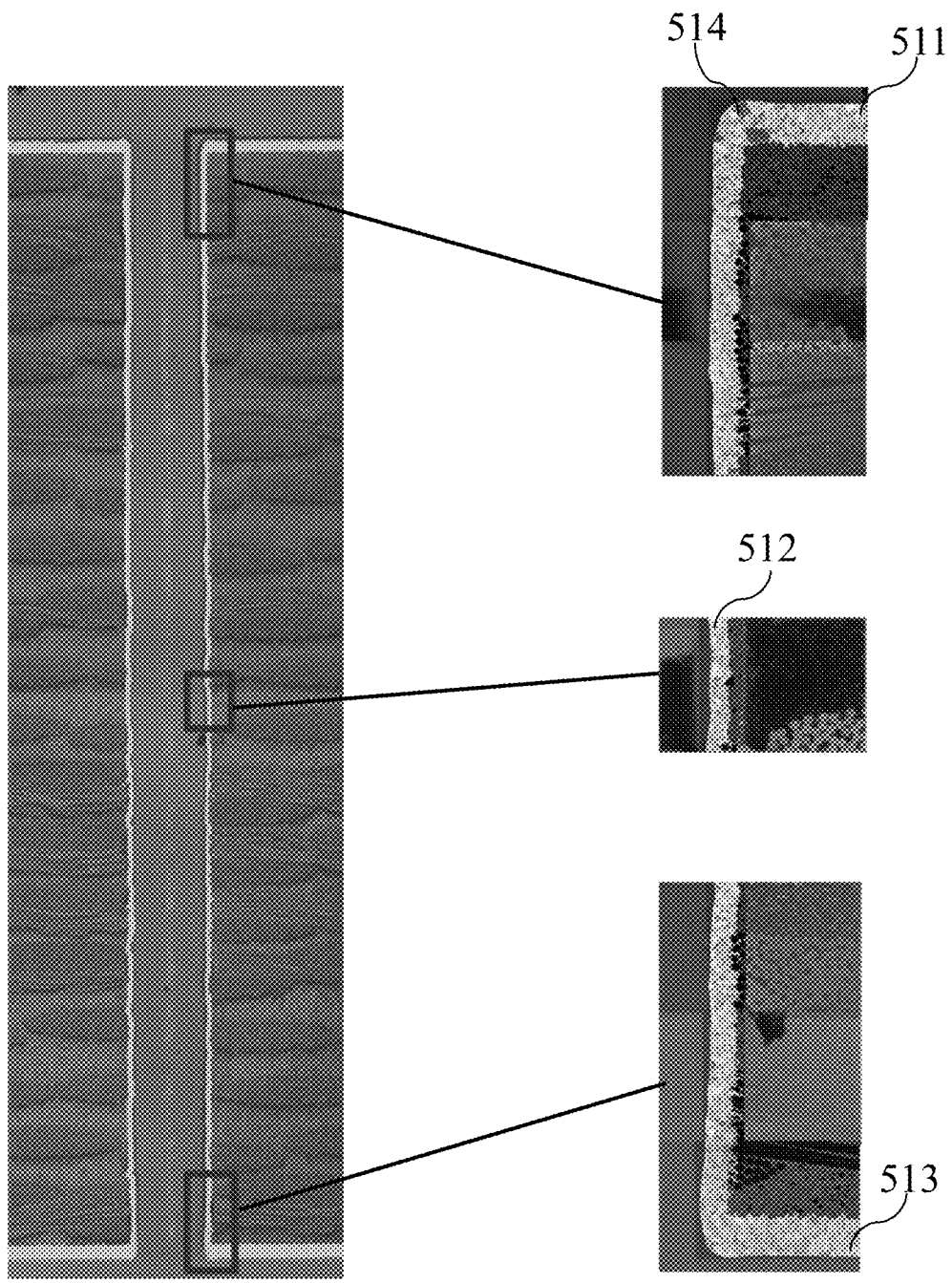
FIG. 5 shows cross sections of a plating through hole (PTH) in a fiberglass (FR4) substrate after the thermal annealing treatment, according to the fourth embodiment of the present invention.

Please refer to FIG. 5, which shows cross section of the plating through hole (PTH) on the fiberglass (FR4) substrate after the heat treatment, according to the fourth embodiment of the present invention. As shown in FIG. 5, the PTH on the FR4 substrate is electroplated through the electroplating process, similar with similar with that performed in the first, second, and third embodiments. The electroplating process can be conducted with the plating current density in a range of 0.1 ASD to 10.0 ASD and electroplated Cu thickness can be 20 μm (surface Cu). After the electroplating process, the thermal annealing treatment is conducted at 180° C. for 2 hours, and the FIB analysis for the PTH structure is then performed to show the electroplated Cu 511-514, as shown in FIG. 5. The observation of FIG. 5 confirms that the electroplated Cu 511, 513, and 514 indeed can be significantly enlarged to as large as approximately 15 μm, particularly for the electroplated Cu 514, i.e., the electroplated Cu deposited at the corner of the PTH structure. In other words, the present invention can be applied to different substrates and different types of holes.

Fifth embodiment

Figure 6:
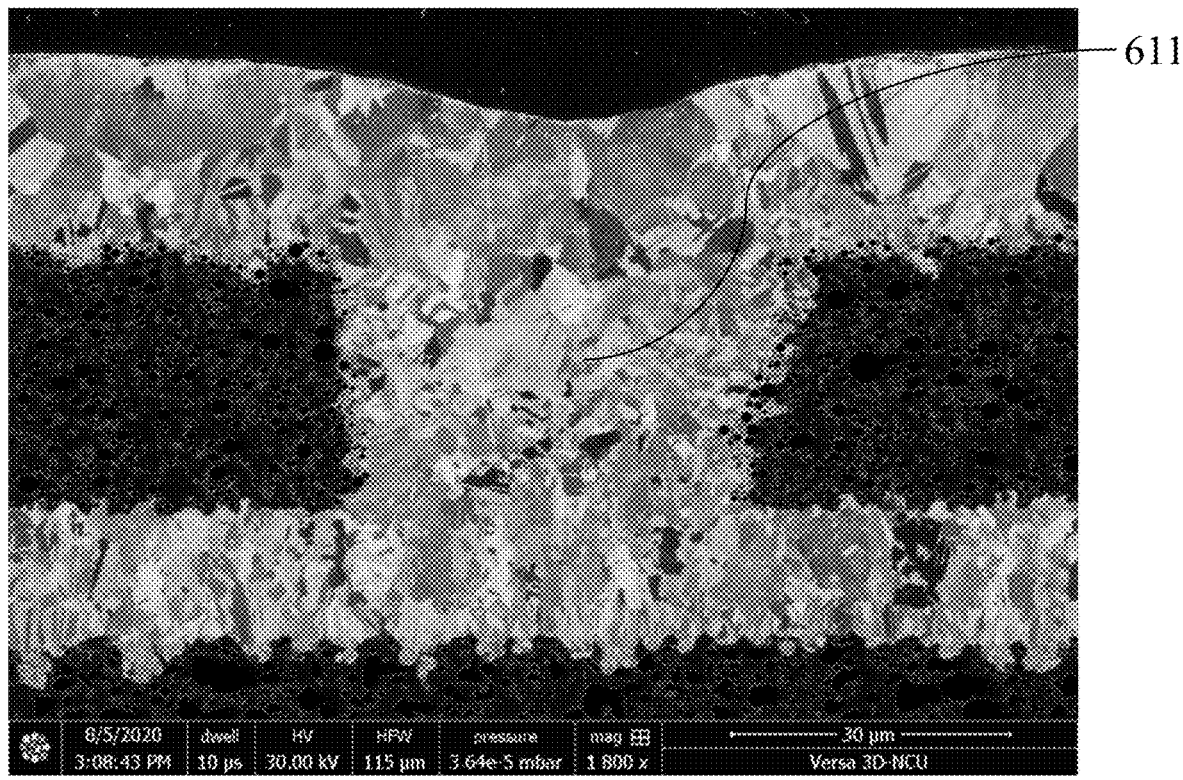
FIG. 6 shows the FIB-processed cross section of a blind via hole (BVH), which is filled with the electroplated copper, in the fiberglass (FR4) substrate after the thermal annealing treatment, according to the fifth embodiment of the present invention.

Please refer to FIG. 6, which shows cross section of a blind hole (BH) filled with the electroplated copper after the heat treatment is performed on the fiberglass (FR4) substrate. As shown in FIG. 6, the BH structure on the FR4 substrate is electroplated through the electroplating process, similar with that performed in the first, second, and third embodiments. The thermal annealing treatment is then conducted at 180° C. for 2 hours, and FIB analysis for cross-section of the BH structure is performed to show the electroplated copper (such as the conducting layer 611) filled in the BH structure. It can be found that the grain size of the electroplated copper in the BH structure can be as large as approximately 10 μm. This embodiment provides direct evidence that the present invention can be applied to different substrates and different type of holes.

In summary, the difference between the present invention and the conventional technology is that in the present invention the electroplating process is performed to deposit the metal thin film with a preferred crystallographic orientation on the surface of the substrate, and the thermal annealing treatment is then performed on the as-electroplated metal thin film, so that the metal thin film with the grain size in a range of 5μm to 100μm can be generated. The thermal annealing treatment can be conducted at the temperature in a range of 25 degree Celsius to 240 degree Celsius. Therefore, the method for microstructure modification of conducting lines can produce the metal thin film with larger crystal grains at low temperature, so as to increase the elongation/ductility of the conducting line(s).

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A method for microstructure modification of conducting lines, comprising:
    performing an electroplating process to deposit a metal thin film with a preferred crystallographic orientation over a surface of a substrate; and
    performing a heat treatment on the metal thin film, to make the metal thin film having the crystal grain sizes in a range of 5 μm to 100 μm, wherein the heat treatment is conducted at a temperature in a range of above 25 degree Celsius and below 240 degree Celsius;
    wherein the metal thin film has a plurality of crystal grains with the preferred crystallographic orientation before the heat treatment is applied to the metal thin film and less than 50% of structure surface of the metal thin film can have the (111) crystal plane preferred orientation with a nanotwinned structure.

2. The method for microstructure modification of conducting lines according to claim 1, wherein the substrate comprises a conducting substrate, an insulating substrate or a combination thereof.

3. The method for microstructure modification of conducting lines according to claim 1, wherein the electroplating process is performed with a plating current density in a range of 0.1 ASD to 10.0 ASD.

4. The method for microstructure modification of conducting lines according to claim 1, wherein the metal thin film has a thickness in a range of 0.1 μm to 500 μm.

5. The method for microstructure modification of conducting lines according to claim 1, wherein a plating solution used in the electroplating process comprises organic acid, inorganic acid or a combination thereof.

6. The method for microstructure modification of conducting lines according to claim 5, wherein the plating solution comprises additives.

7. The method for microstructure modification of conducting lines according to claim 1, wherein the heat treatment is conducted for more than one minute and less than 50 hours.

8. The method for microstructure modification of conducting lines according to claim 1, wherein the material of the metal thin film comprises gold (Au), silver (Ag), copper (Cu), cobalt (Co), iron (Fe), nickel (Ni), lead (Pb), palladium (Pd), platinum (Pt) or a combination thereof.

* * * * *